United States Patent [19]
Lee

[11] Patent Number: 6,078,194
[45] Date of Patent: Jun. 20, 2000

[54] LOGIC GATES FOR REDUCING POWER CONSUMPTION OF GALLIUM ARSENIDE INTEGRATED CIRCUITS

[75] Inventor: Gary M. Lee, Moorpark, Calif.

[73] Assignee: Vitesse Semiconductor Corporation, Camarillo, Calif.

[21] Appl. No.: 08/558,108

[22] Filed: Nov. 13, 1995

[51] Int. Cl.$^7$ .............................................. H03K 19/0952
[52] U.S. Cl. .............................................. 326/116; 326/31
[58] Field of Search ........................... 326/21, 31, 33–34, 326/116, 121; 327/544

[56] References Cited

U.S. PATENT DOCUMENTS

| | | | |
|---|---|---|---|
| 4,384,220 | 5/1983 | Segawa et al. | 326/33 X |
| 4,503,341 | 3/1985 | Shah | 326/33 X |
| 4,567,385 | 1/1986 | Falater et al. | 326/33 X |
| 4,763,021 | 8/1988 | Stickel | 326/33 X |
| 5,294,928 | 3/1994 | Cooper et al. | 327/544 X |

*Primary Examiner*—David R. Hudspeth
*Attorney, Agent, or Firm*—Christie, Parker & Hale

[57] ABSTRACT

A method and apparatus for reducing power consumption by gallium arsenide integrated circuits divides the integrated circuit into higher and lower frequency sections. The high frequency sections require a substantial portion of the system clock period to resolve their longest combinatorial paths. The lower frequency sections require a relatively small portion of the system clock period to resolve their longest combinatorial logic paths. The combinatorial logic paths of each of such lower frequency sections are designed using logic gates which are capable of being decoupled from the chip power supply by way of a power enable input. Edge triggered memory circuits such as flip-flops are also designed using the reduced power logic gates, except for their cross-coupled outputs so that they may retain their state. A dual-output one-shot multivibrator is used to generate the power enable signal used to couple and decouple the logic gates of each lower frequency section from the chip power supply, as well as the clock pulse with which to clock the flip-flops of the lower frequency section. The one-shot generates these control signals based on the positive edge of the system clock. The lower frequency sections thus dissipate virtually no power except during that portion of the system clock period necessary to resolve their longest combinatorial paths.

12 Claims, 7 Drawing Sheets

LOGIC GATES FOR REDUCING POWER CONSUMPTION OF GALLIUM ARSENIDE INTEGRATED CIRCUITS

BACKGROUND OF THE INVENTION

1. Field of the Invention

The present invention relates to power management in integrated circuits, and more particularly to a method and apparatus for reducing power consumption in integrated circuits which are manufactured using technologies such as gallium arsenide (GaAs), which manages power consumed by sections of the circuit which operate at frequencies considerably lower than the system clock frequency.

2. Background of the Related Art

In the design of computers and other digital systems, engineers must often sacrifice power consumption to maximize speed of operation or vice versa. This is because these two parameters are nearly always inversely related. Other parameters such as noise margin can be sacrificed to limit power consumption but with adverse affects. Circuits manufactured using CMOS device technology tend to consume less power but typically achieve lower maximum frequencies of operation compared to circuits fabricated using other available technologies, such as bipolar silicon and gallium arsenide. The latter technologies, however, exhibit higher power consumption relative to CMOS circuits.

CMOS digital circuits consume less power because they employ a device structure which conducts current only during the time that the device is switching between a high and low binary output state. Once in either state, the device is virtually nonconductive. CMOS technology achieves this desirable characteristic by stacking two or more complimentary devices to produce a logic gate such that a p-channel device has its source coupled to the positive supply terminal of the circuit, has its gate and drain terminals coupled to the gate and drain terminals of an n-channel device respectively, and the source of the n-channel is coupled to the ground terminal of the circuit supply. It is significant that CMOS technology lends itself easily to producing p-channel and n-channel devices together in the same substrate because they are easily isolated by silicon oxide layers.

The above-described CMOS structure forms an inverter such that when the input of the inverter (i.e. the common gate terminals) is at or near 0 volts, the p-channel device turns on long enough to charge a capacitive load on the output of the inverter formed by the common drain terminals). Once the capacitance has been charged, there is no other path through which current can flow because the n-channel device is cut off and the input to the next logic device is one or more capacitive gates. Thus, once this state is reached no substantial current is flowing. When the input becomes equal to about the supply voltage, the p-channel cuts off, the n-channel device discharges the output capacitance to ground and again substantial current ceases to flow.

Continued advances in photolithography have provided steady reductions in circuit feature sizes, reducing bad capacitance and thus increasing the maximum frequency of operation of CMOS circuits. Of course, as CMOS circuits are driven at higher speeds, power dissipation goes up because the gates spend more time switching than in their nonconductive static states. Thus, while CMOS technology has begun challenging gallium arsenide technology for higher frequency applications, it has done so at the expense of power dissipation.

Prior art gallium arsenide (GaAs) circuits are still significantly faster than CMOS circuits but GaAs technology does not lend itself well to device implementations which can exploit the complimentary structure of CMOS devices. Further, transistor devices implemented in gallium arsenide, known as metal semiconductor field effect transistors (MESFETS), have parasitic Schottky diode structures coupled between their gate and source terminals as well as between their gate and drain terminals, which conduct current when properly biased. These parasitic Schottky diodes are inherent to the gallium arsenide manufacturing process. FIG. 1 illustrates a typical prior art GaAs Direct Coupled FET Logic (DCFL) inverter, comprising typical MESFETS 10 and 12, which drives another logic circuit the input of which is represented by MESFET 14. MESFET 10 is an n-channel device operated in the depletion mode so that a negative gate-to-source voltage is required for it to be cut off.

Because the gate and source of MESFET 10 are shorted, the depletion mode device conducts regardless of the voltage on output 20. Thus, when the input voltage of the inverter (as applied to the gate of MESFET 12) is a logic high, the input voltage is clamped at about 0.7 volts by the parasitic gate-to-source Schottky diode of load MESFET 12 (represented by diode 13). The output voltage on line 20 is then pulled low by MESFET 12 and the current supplied by MESFET 10 is conducted by MESFET 12 in the process. Because the gate-to-source voltage is close to zero for MESFET 14, it is cut off. Thus power is consumed the entire time that the inverter of FIG. 1 remains in this static state.

When the voltage applied to the gate of the transistor 12 is low (typically about 0.1 volts), MESFET 12 is cut off and output line 20 is pulled towards $V_{cc}$ and is clamped at about 0.7 volts by the parasitic gate-to-source Schottky diode 18 of load MESFET 14. Parasitic diode 18 now conducts the current sources by depletion mode MESFET 10. Thus, the typical GaAs logic gate consumes power both while switching and while in either static binary state.

A typical implementation of a very high-performance digital system uses a gallium arsenide circuit for those portions of the system requiring the highest speed of operation, while those portions of the system which do not have to operate at the highest frequencies are implemented on a CMOS chip, thereby reducing overall system power dissipation. This solution is not all that desirable because manufacturing two chips in two different technologies is inconvenient and more expensive, especially when both the high-speed and low-speed circuitry could otherwise be integrated onto the same chip.

Thus, attempts have been made in the past to minimize the power consumed by GaAs logic circuits and in particular, the GaAs circuitry which operates at lower maximum frequencies (i.e. typically <10 MHz). One approach attempts to minimize the amount of current supplied by the depletion mode device (i.e. MESFET 10, FIG. 1). This has been accomplished with only marginal success by increasing its gate length and minimizing its gate width. The problem with this approach is that it increases the logic cell area as a result of the unusual device geometry that such an adjustment of the depletion mode device produces. Further, in gate arrays, device sizes are fixed and there are very few device geometrics to choose from.

Another known approach is to modify the process of manufacturing GaAs logic circuits to permit implementation of a complimentary design analogous to that of CMOS circuits. A type of p-channel MESFET device has been manufactured and implemented in complimentary fashion with an n-channel device to form inverter 21 as illustrated in FIG. 2. The p-channel device is a modulation doped heterostructure field effect transistor (pHFET) 22 and the n-channel is an all-implanted n-channel JFET 24. The output of the inverter 21 is coupled to the input of another logic gate (i.e inverter 23). FETS 24 and 26 still have the parasitic Schottky-type diodes as represented by diodes 28 and 30. Thus, when the input to inverter 21 is at a logic low, pHFET 22 supplies current through diode 30 of inverter 23.

To make this logic act more like CMOS, the supply voltage must be reduced towards the diode turn-on voltage of the n-channel JFET to reduce the current sourced by pHFET 22 while in the logic high state. This approach creates large variations in pull-up drive and power supply current due to the small voltage drop across the pHFET. Power dissipation increases substantially as the supply voltage is increased even a few tenths of a volt to increase noise margin (e.g. power dissipation has been shown to increase as much as twenty times when the voltage is increased from 0.8 volts to 1.2 volts). Additionally, processing is more difficult and costly because of the added complexity of manufacturing the pHFET device.

Another known approach to reducing power dissipation is to use a logic signal as the source of power for the depletion mode device of a logic gate, thus only dissipating significant power through the logic gate when the gate is needed for evaluation of its other logic input signals. Examples of an inverter 31 and a NOR gate 33 implemented using such an approach are shown in FIG. 3. When the A input is a logic high, the inverter 31 and the NOR gate 33 behave like conventional gates, with the depletion mode device 35 sourcing current to FETS 37 and 39 when the logic inputs are high, and sourcing current to the parasitic diode of the next gate when the logic input is a low. When the A input is a logic low, the output of the gate is maintained at a logic low with virtually no power dissipation, regardless of the value of the other logic inputs.

While this approach is good for combinational logic driven by enable signals, such as multiplexers, it is not that convenient for use with all of the combinational and sequential logic which might be employed in a gallium arsenide circuit. Moreover, this technique makes circuit design complex because a single depletion mode device might have to drive several "A" inputs which in turn may themselves drive several other "A" inputs and so on. Thus either special sizing of the depletion mode device is required, depending on the number of A inputs driven by a particular depletion mode device, or fan-out restrictions must be placed on the number of A inputs which can be driven by the outputs of such devices.

The prior art approaches for decreasing power consumption in GaAs circuits have considerable shortcomings and thus room exists in the art of GaAs circuit design to provide significant reductions in power dissipation without the above-described disadvantages. Because GaAs circuits are still faster than CMOS circuits, it is desirable to use GaAs devices in digital systems requiring very high speeds of operation. While CMOS technology has made big gains in speed of operation with commensurate increase in power dissipation, GaAs circuits still dissipate much more power than CMOS at frequencies below 50 MHz. Thus, it is highly desirable to reduce overall power consumption by GaAs circuits through management of power distributed to logic sections of GaAs circuits operating at lower maximum frequencies. This permits overall reductions in power consumption without compromising circuit speed, accuracy and cost of manufacture.

SUMMARY OF THE INVENTION

The present invention provides a method and apparatus for reducing power consumption in gallium arsenide logic circuits, by managing power distribution to the lower frequency sections of the GaAs circuit which have often been implemented in CMOS circuitry on a separate chip. The logic gates of the lower frequency sections of a GaAs circuit can resolve data inputs to be latched or clocked into their flip-flops within as little as 5% of the typical system clock cycle. Thus, the logic gates of these sections are otherwise standing-by, dissipating full power for no reason during as much as 95% of the clock period. Power is therefore strategically provided to the lower frequency sections of circuitry for only as long as it is necessary for their signals to be evaluated and latched during each system clock cycle. The higher frequency sections (i.e. those sections requiring a substantial amount of the system clock period to evaluate their signals to be latched), remain continuously powered.

The logic gates of the present invention are modified versions of classic direct coupled FET logic (DCFL) gates. They comprise one or more n-channel MESFETS operated in the enhancement mode, their gate terminals forming logic inputs to the DCFL logic gates, their source terminals being coupled to $V_{TT}$ (i.e. the negative supply rail) and their drain terminals being coupled to the output of the DCFL logic gate and a load. The load is formed by at least one n-channel MESFET operated in the depletion mode, its gate being coupled to its source and then to the output of the gate. Finally, the logic gates include an enhancement mode n-channel MESFET coupled between $V_{cc}$ (i.e. the positive supply rail) and the load in a source-follower configuration, with its gate coupled to a power enable signal (PEN), its drain coupled to $V_{cc}$ and its source coupled to the drain of the at least one depletion mode device.

When the PEN signal is high (i.e. about 1 volt or greater), the voltage on the source terminal of the enhancement mode device follows its gate terminal voltage, thereby providing a voltage to the drain terminal of the depletion mode device approximately equal to the logic high value of PEN minus one threshold voltage. This voltage at the drain of the depletion mode device then permits the gate to operate as a conventional DCFL gate. When the PEN signal is a logic low (i.e. $V_{TT}$), the source follower turns off, the voltage at the drain of the depletion mode device becomes nearly $V_{TT}$, and the logic gate ceases to conduct any appreciable steady-state current. The output of the gate (i.e. OUT 100) floats high impedance assuming that the logic gates driving its logic inputs (A and B) are also power managed or driven low by gates which are still powered-up. If one of the logic inputs is driven high by a gate which is still powered-up, OUT 100 will be pulled low. A high impedance input to another DCFL gate is the same as a logic low because an input current is required to bias the Schottky gate to a logic high. While in the powered-down state, the logic gate dissipates no steady-state power; it only dissipates power when PEN is at its logic high value.

These modified DCFL logic gates are used in the cells comprising the lower frequency sections of a gallium arsenide circuit where the logic sits in a quiescent state for most of the system clock cycle permitting them to be turned off except for a small period at the start of each clock cycle during which their states are updated based on new values of their inputs. A single Power Enable (PE) signal can be generated and distributed to an entire such section, being connected to the PEN input of virtually all gates comprising the section. The preferred embodiment control of the invention includes a control circuit to generate the active high PE signal for a given section from the system clock (CLK) including a first one-shot circuit. The first one-shot circuit ensures that the PE signal is active long enough for all of the combinatorial logic circuits in the section to produce an updated result and for that result to be latched or clocked into a flip-flop. Only the final cross-coupled stages of the latches and flip-flops in such a logic section are implemented with conventional DCFL logic gates (i.e. no PEN input) because they must be continuously powered to retain their updated states.

A second one-shot circuit produces an active high clock pulse (CP) signal from CLK which is also distributed to a given section to clock all of its latches and flip-flops. CP is active while the PE signal is active but the rising edge of CP can not occur before all combinatorial logic of the section producing inputs to its latches and flip-flops has had an opportunity to fully evaluate. The time between the rising edge of PEN and the rising edge of CP is therefore governed by the longest combinatorial logic path in the section. The width of CP must be such that appropriate operation of the section's flip-flops is realized. The falling edge of CP must occur before PEN becomes inactive to ensure that the results are latched.

Thus, the logic circuits of the reduced power section of the GaAs circuit are powered off until just long enough during each cycle of the system clock for the new logic values produced by the section's combinatorial logic to completely evaluate and be latched or clocked into flip-flops. Only the output stages of the latches and flip-flops of the lower frequency section, as well as the one-shot circuits producing CP and PE from CLK for the section need remain continuously powered. PE and CP can be distributed throughout a particular logic section as with conventional clock trees. Further, multiple pairs of CP and PEN signals can be generated, each pair generated by a control circuit each for a different logic section having different critical timing requirements.

Therefore, all sections but those having longest path lengths substantially equal to the system clock period could be power-managed in accordance with the present invention. The trade-off between the additional chip area required for overhead circuitry necessary to generate the signals which drive the the power managed circuitry and the actual power dissipation conserved will likely dictate that it will be cost effective to power manage only those sections having longest path lengths that are substantially less than the system clock period.

DETAILED DESCRIPTION OF THE INVENTION

The present invention discloses a method and apparatus by which the overall power of a gallium arsenide digital circuit may be reduced by selectively managing power to all lower frequency sections of the circuit. In the following description, numerous specific details are set forth in order to provide a through understanding of the present invention. However, it will be apparent to one skilled in the art that the present invention may be practiced without these specific details. In other instances, well-known circuits, structures and the like are not described in detail so as not to obscure the present invention unnecessarily.

Figure 1:
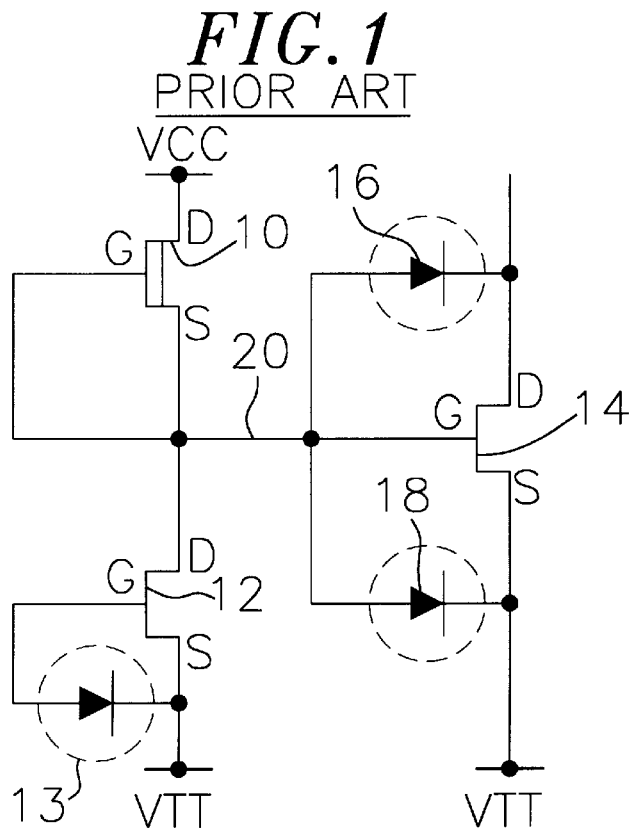
FIG. 1 is a circuit diagram of a conventional DCFL GaAs logic circuit.
Figure 2:
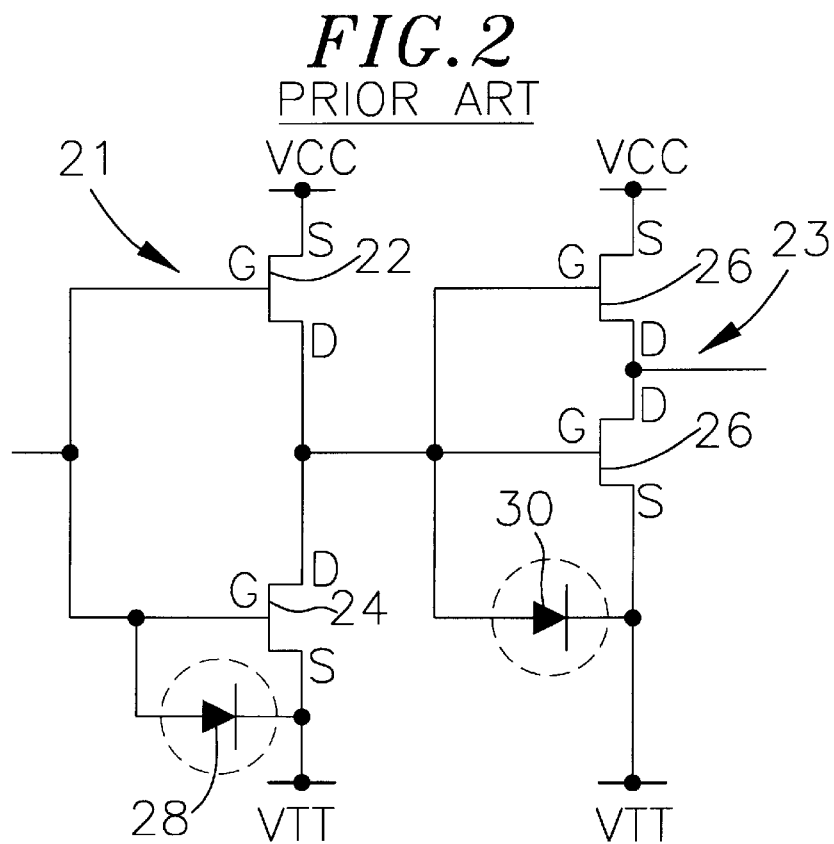
FIG. 2 illustrates a prior art technique for reducing the power consumed by GaAs logic circuits using a complimentary p-channel device.
Figure 3:
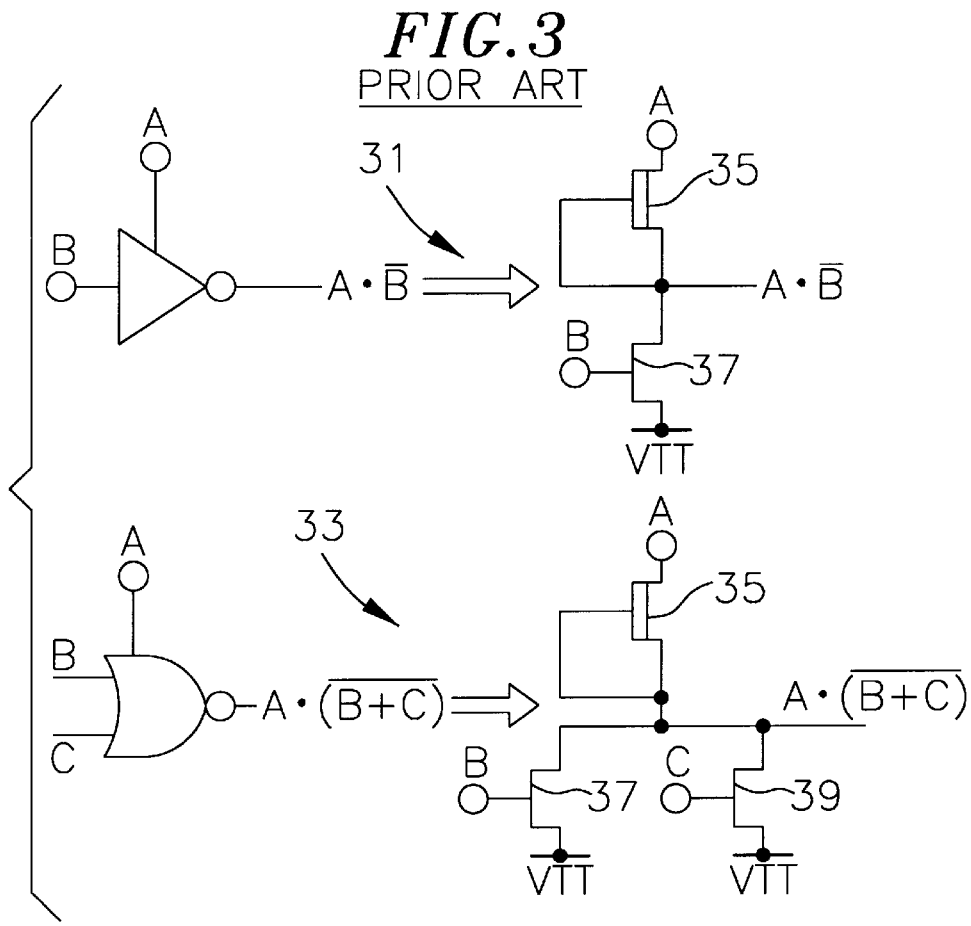
FIG. 3 illustrates a prior art technique for using an additional logic signal to enable and disable DCFL-type logic gates to reduce power dissipation.
Figure 4A:
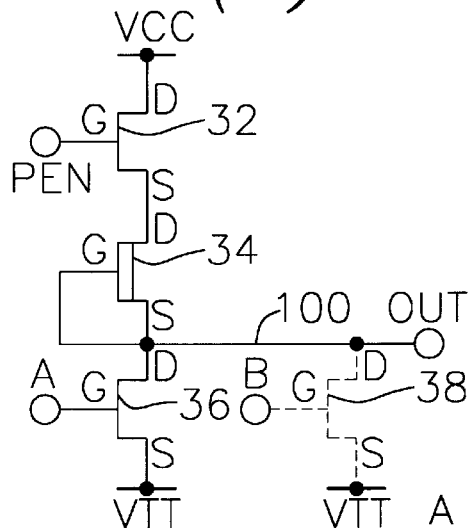
FIG. 4(a) is a first preferred embodiment of a logic gate employing the teachings of the present invention.

FIG. 4(a) is a circuit diagram of a first preferred embodiment of a logic gate employing the teachings of the present invention. Without enhancement mode MESFET 38, the logic gate of FIG. 4(a) is an inverter and with it, the logic gate is a NOR gate. As will be readily appreciated, the teachings of the present invention may be applied to other types of logic gates which can be configured using DCFL. As shown, the basic logic gate of the present invention comprises at least MESFET 36, the gate terminal of which receives a logic input voltage. The gate terminal of MESFET 38 is the logic input "A" of the logic gate. The drain terminal of MESFET 38 is coupled to the source terminal of MESFET 34 to form the output of the logic gate. MESFET 34 operates in the depletion mode. The logic gate of FIG. 4(a) further comprises a MESFET 32, operating in the enhancement mode, which is coupled between MESFET 34 and the positive supply rail $V_{cc}$ as a source-follower. The gate terminal of MESFET 32 forms the PEN control input to the logic gate.

When a voltage of at least 1 volt is applied to the PEN input, the source of MESFET 32 rises to approximately the same voltage (minus one threshold voltage), and thus the logic gate of FIG. 4(a) operates as a conventional DCFL logic gate. If MESFET 38 is not included, the logic gate is a simple inverter, inverting the logic level on input A and outputting that inverted level on OUT 100. If MESFET 38 is included, the logic gate is a two-input NOR gate. When a voltage equal to $V_{TT}$ is applied to the PEN input, the output of the gate (i.e. OUT 100) floats high impedance assuming that the logic gates driving its logic inputs (A and B) are also power managed or driven low by gates which are still powered-up. If one of the logic inputs is driven high by a gate which is still powered-up, OUT 100 will be pulled low. Regardless, no steady-state power is dissipated by the logic gate while in this state.

Figure 4B:
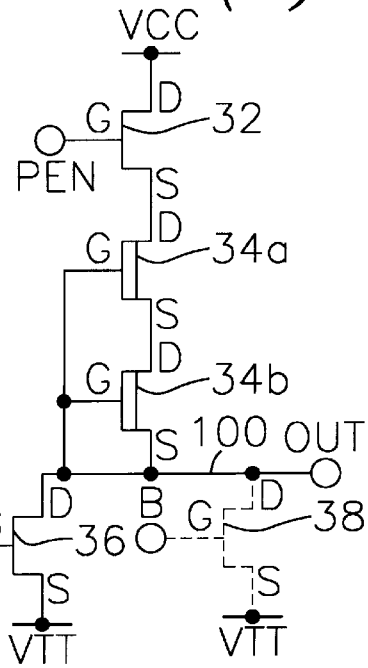
FIG. 4(b) is a second preferred embodiment of a logic gate employing the teachings of the present invention.

A second preferred embodiment of a logic gate of the present invention is disclosed in FIG. 4(b). In this embodiment, two depletion mode MESFETS 34a and 34b are stacked together to increase the effective gate length over the single MESFET 34 of FIG. 4(a). This reduces the current flowing out of the logic gate when the output is high to about one-half of the structure of FIG. 4(a).

Figure 5:
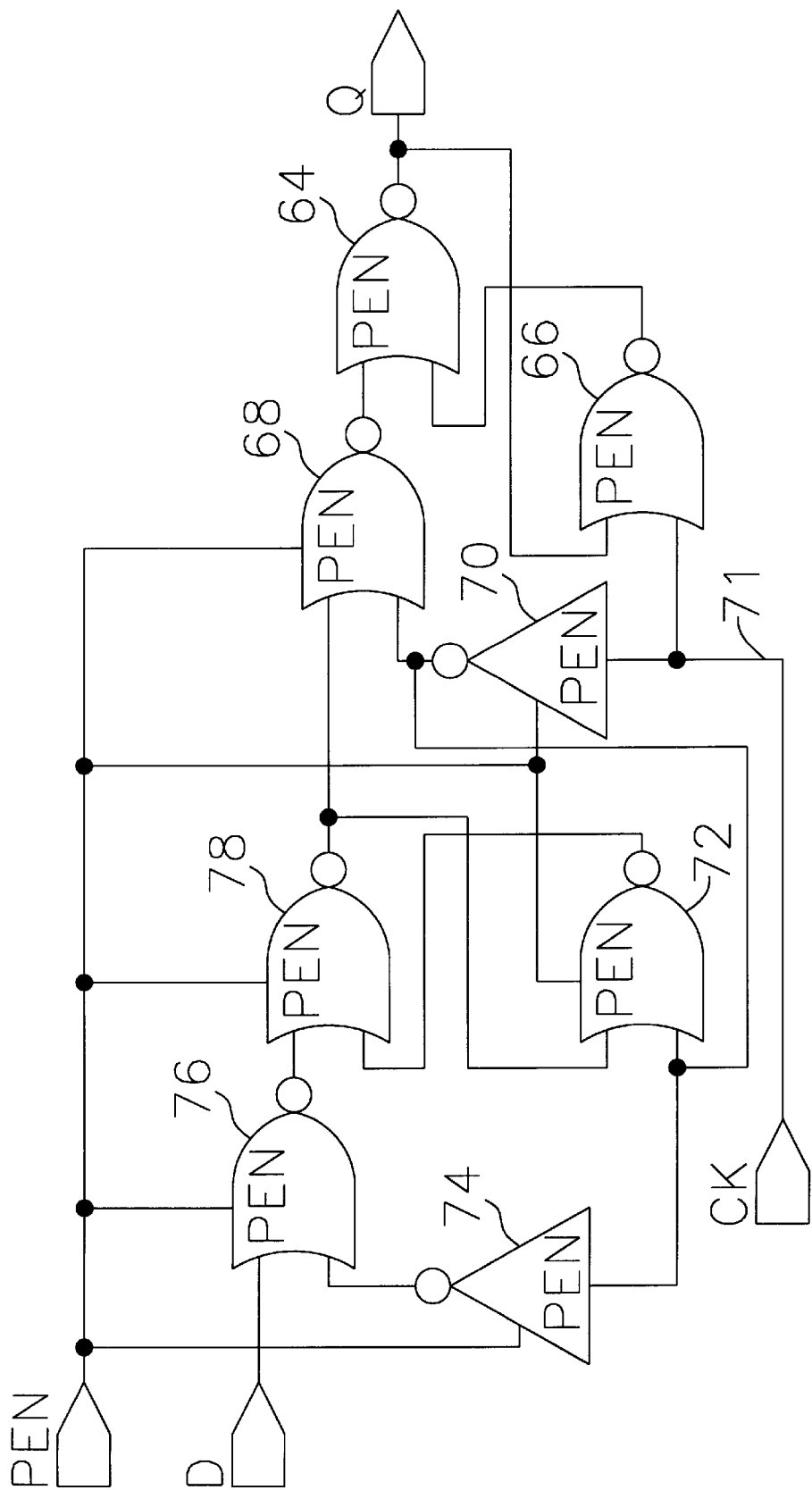
FIG. 5 is a preferred embodiment of a flip-flop incorporating the teachings of the present invention.

A preferred embodiment of a flip-flop circuit is illustrated in FIG. 5. NOR gates 68, 72, 76 and 78, as well as inverters 70 and 74 are configured in accordance with one of the logic gate embodiments of FIGS. 4(a) or 4(b). NOR gates 64 and 66 are configured as conventional DCFL gates without a PEN input. Thus, when the logic level on the PEN input 69 to the flip-flop is driven to greater than 1 volt, all of the logic gates operate in a conventional manner. When clock pulse input CP 71 is brought to a logic high while PEN is high, the logic value on data input D 73 is clocked into the cross-coupled latch formed by NOR gates 72 and 78. When CP 71 is brought low, the value on input D is clocked into the cross-coupled latch formed by NOR gates 64 and 66. When PEN is brought low, the new value of D is retained in the cross-coupled latch formed by NOR gates 64 and 66 because they are never decoupled from the powered supply. The remaining logic gates are decoupled from the supply and they conduct no current and thus consume no power.

Figure 6:
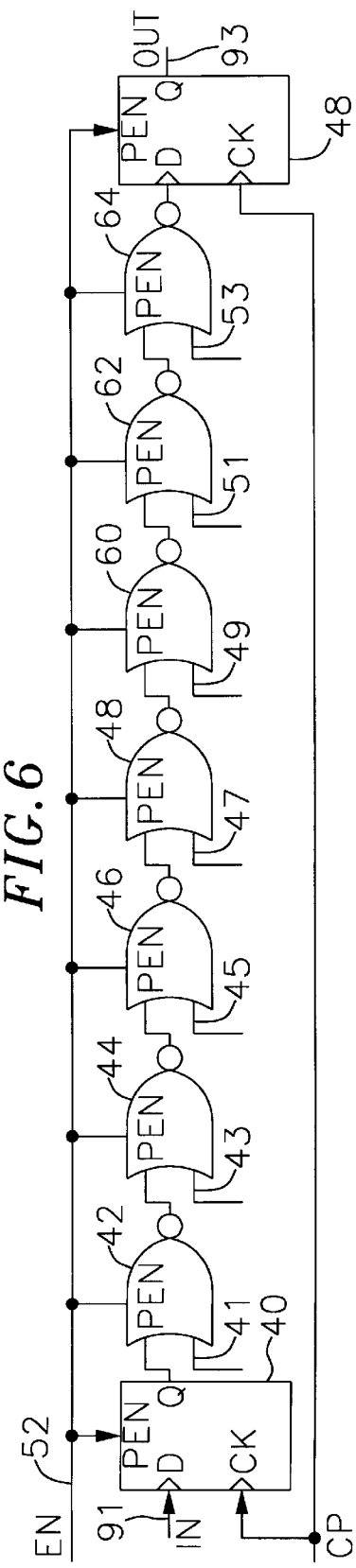
FIG. 6 is an example of a power-managed logic section in accordance with the present invention.

FIG. 6 is a gate level diagram of a logic circuit which might hypothetically form a combinatorial logic path in a lower frequency section of a GaAs digital circuit. The logic circuit might include a series of NOR gates 42, 44, 46, 48, 60, 62 and 64 designed in accordance with one of the embodiments of FIG. 4(a) or 4(b). Inputs 41, 43, 45, 47, 49, 51, and 53 might be coupled to other subsections of combinational logic, either in the power-managed section or in the conventionally designed higher-frequency sections. The logic circuit of FIG. 6 further includes flip flops 40 and 48 which are clocked to produce new output states which depend on the values of their respective D inputs at the rising edge of the signal used CP50 to clock them. These flip-flops are designed in accordance with the embodiment of FIG. 5. A common power enable signal (PE 52) is coupled to the PEN inputs of the flip-flops 40 and 48 and the NOR gates 42, 44 46, 48, 60, 62 and 64 as illustrated in FIG. 6.

Figure 7:
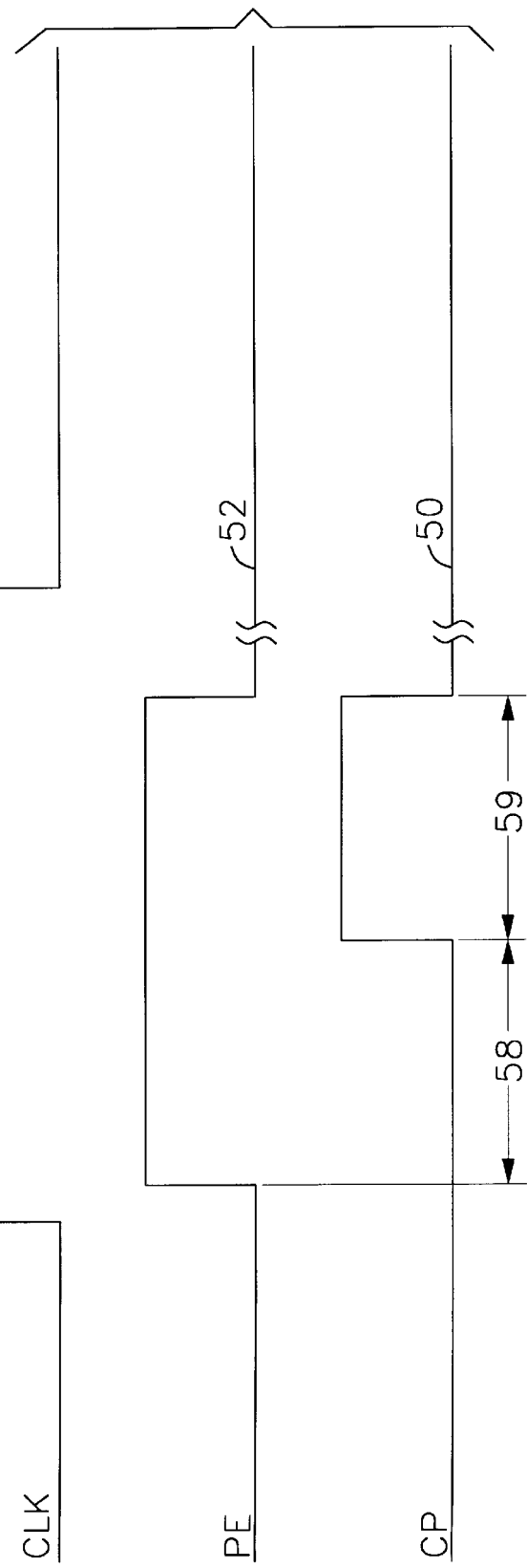
FIG. 7 is a timing diagram illustrating preferred timing relationships between the system clock, power enable and clock pulse signals of the present invention.

FIG. 7 illustrates the preferred timing relationship between the overall system clock 55 for the GaAs circuit, and the internally generated clock pulse CP 50 and enable EN 52 signals of the present invention. The system clock (CLK) 55 is the clock signal which drives the whole GaAs circuit including the highest frequency circuitry. Signal EN 52 and signal CP 50 are derived from CLK signal 55 to ensure that the lower speed logic sections such as that shown in FIG. 6 remain synchronous with the high frequency logic sections. As shown, EN 52 preferably changes from a low state to an active high state shortly after the rising edge of CLK 55, to provide power to the logic gates of the lower speed logic section. Signal CP 50 preferably changes from a low state to a high state only after all of the combinational logic paths of the lower speed section have produced valid results. Put another way, all critical paths must be resolved during interval 58. When CP 50 changes from a low state to a high state, the newly updated input data is clocked into the flip-flops ( and any latches) of the lower speed section. When CP 50 returns low, the state of the flip-flops of the lower speed section are updated. The duration 59 of CP 50 must be sufficient to permit the data to be clocked through the flip-flop. Those of skill in the art will recognize that latch designs can be used which update outputs on the positive edge of CP 50 as well. Because the final cross-coupled stages of the latches and flip-flops of the lower speed section are not controlled by EN 52, their updated states are maintained for the duration of the current cycle of CLK 55. It should also be noted that EN 52 should remain active long enough (i.e. sufficient hold time) so that the negative edge of CP 50 successfully updates the continuously powered final stages of all flip-flops and latches of the low speed section.

Figure 8:
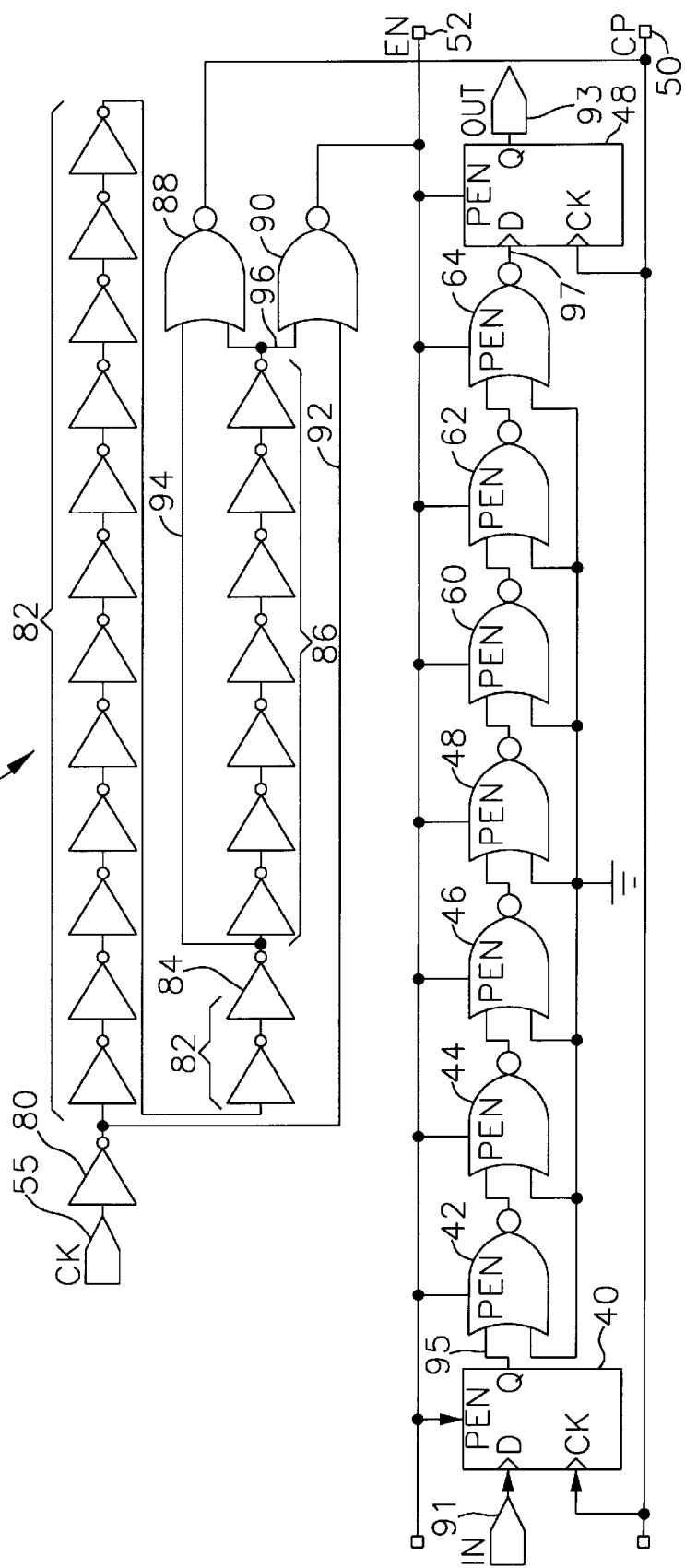
FIG. 8 illustrates a preferred embodiment of a control circuit for generating the power enable and clock pulse signals and its interconnection with the example power-managed logic section of FIG. 6.

FIG. 8 illustrates a preferred control circuit for generating signals EN 52 and CP 50 from CLK 55, and illustrates how those signals would be interfaced to a low frequency logic section such as the one illustrated in FIG. 6. The preferred circuit for generating EN 52 and CP 50 is a double one-shot circuit which is triggered by the positive edge of CLK 55 and rearmed when CLK 55 becomes low. The control circuit outputs corresponding to EN 52 and CP 50 are low just prior to a rising edge of CLK 55, as inputs 92 and 94 to NOR gates 90 and 88 respectively are logic highs. When CLK 55 becomes high, EN 52 goes high approximately two gate delays later (the signal has to propagate through inverter 80 and output NOR gate 90). The logic high from CLK 55 continues to propagate through the inverter chain and when it propagates through inverter 84, CP becomes a high as well. In the example of FIG. 8, CP 50 becomes high approximately sixteen gate delays after CLK 55 becomes high, about fourteen gate delays after EN 52 becomes a high.

Thus, the number of inverters in segment 82 of the inverter chain will be determined by the worst-case logic path in the power-managed (i.e. lower-frequency) logic section. Of course, the total number of inverters in segment 82 plus the number of inverters between segment 82 and CLK 55 must remain odd to preserve the circuit's logical operation. The logic high from CLK 55 continues to propagate through the remaining segment 86 of inverters, upon which input 96 becomes a high and both EN 52 and CP 50 become logic lows. The number of inverters in segment 86 is dictated by the minimum clock pulse width requisite for proper operation of the flip-flops. Again, the number of inverters in segment 86 plus the number of inverters in segment 82 plus the number of inverters between segment 82 and CLK 55 must be even to preserve proper logical operation of the control circuit.

It should also be noted that there must be sufficient hold time between CP 50 going low and EN 52 going low such that the new states are stored into the final stages of the flip-flops. Because NOR gate 90 has to swing from 1.5 to 0 volts, its fall time may provide sufficient hold time without need for introducing any further delay.

Figure 9:
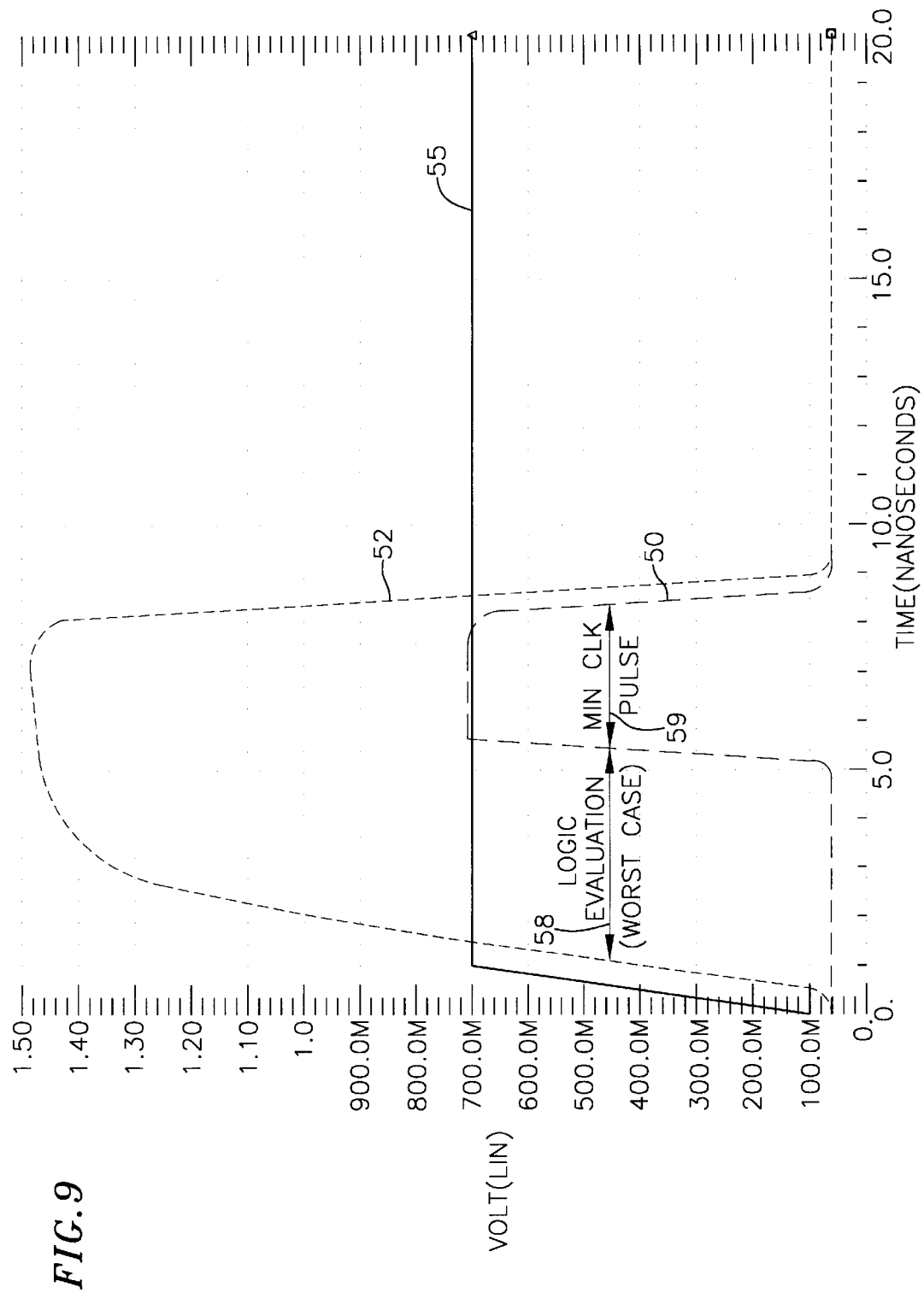
FIG. 9 illustrates a simulated output from the control circuit of FIG. 8.
Figure 10:
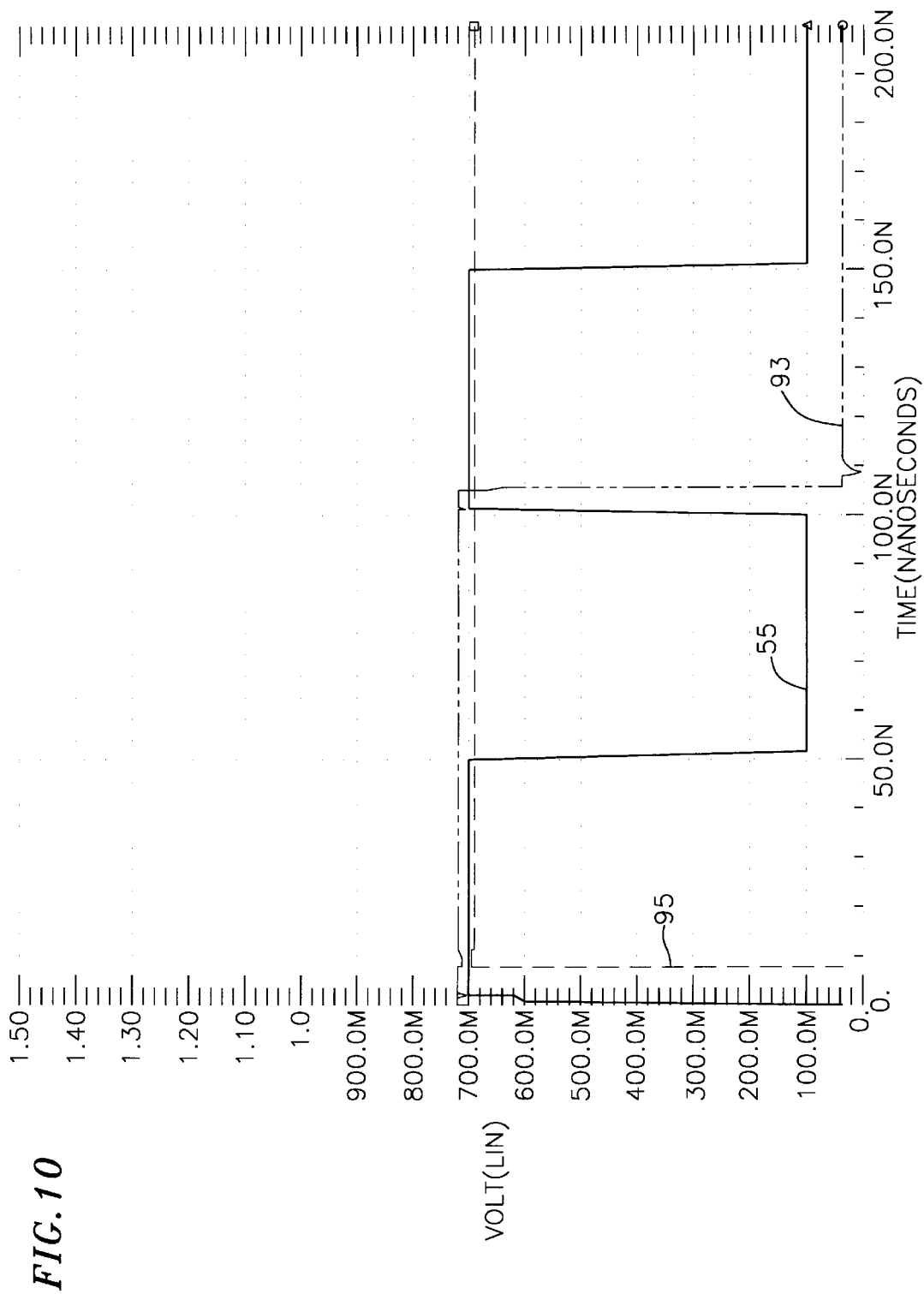
FIG. 10 illustrates a simulated output from the power-managed logic section of FIGS. 6 and 8, over two cycles of the system clock, as driven by the control circuit of FIG. 8.

A typical set of waveforms generated by the example control circuit of FIG. 8 is shown in FIG. 9. FIG. 10 is a waveform diagram showing the outputs of flip-flops 40 and 48 while driving the logic segment of FIG. 8 with the waveforms of FIG. 9 for two cycles of CLK 55, assuming IN 91 is a high and OUT 93 is a high just prior to the first cycle. As can be seen, the output 95 of the first flip-flop 40 becomes a high at the falling edge of CP 50 during the first cycle of CLK 55, and OUT 93 becomes a low at the falling edge of CP 50 during the second cycle of CLK 55. This is because the high from flip-flop 40 runs through the inverter chain formed by NOR gates 42, 44, 46, 48, 60, 62 and 64 (their second inputs are tied off to $V_{TT}$ for simplicity) and is presented to input 97 of flip-flop 48 prior to the rising edge of CP 50 during the second cycle of CLK 55.

One benefit of producing the waveforms of FIG. 9 using the control circuit of FIG. 8 is that for each of the lower frequency sections, any increase or decrease in its worst case path delay and/or the minimum clock pulse width required by its flip-flops, caused by changes in temperature or variations in processing, should be equally reflected in the delays produced by the inverter chains. Put another way, the worst case logic evaluation time 58 and minimum clock pulse width 59 signals PE and CP produced by the control circuit should track any variations in path delay due to temperature and/or processing.

The interface between the power-managed sections and the standard logic sections will have a built-in clock skew equal to the logic evaluation time (58, FIG. 9) for a particular power-managed section. This can be overcome by adding additional delay at the interface or using intentional double-clocking.

It is contemplated that the low-frequency sections to be power-managed will involve considerable amounts of logic such as that shown by example in FIGS. 6 and 8. Thus, the overhead in power and area required for the control circuit will be spread over a substantial amount of power-managed logic. Moreover, it is contemplated that computer aided design (CAD) tools can be programmed to identify the sections of logic suitable for power-management as well as to determine the worst-case critical path. Finally, it is contemplated that CAD tools can be programmed to recalculate critical path delays in view of an actual final layout and adjust the length of control circuit inverter chains to accommodate any changes in such delays as recalculated.

Although the present invention has been described in terms of a preferred embodiment and with reference to FIGS. 1–10, it will be appreciated that various modifications and alterations might be made by those skilled in the art without departing from the spirit and scope of the invention. The scope of the invention should therefore be measured in terms of the claims which follow.

I claim:

1. A power conserving logic gate having one or more logic inputs, a power enable input and a logic output, said logic gate comprising:
    a power control device having first and second current conducting terminals and a current controlling input, said first current conducting terminal coupled to a supply voltage and said current controlling input corresponding to said power enable input, said power control device comprising an enhancement mode MESFET;
    a load comprising a depletion mode MESFET having first and second current conducting terminals and a current controlling terminal, wherein said first current conducting terminal of said load is coupled to said second current conducting terminal of said power control device; and
    a logic circuit having one or more input control terminals corresponding to said one or more logic inputs, a first terminal corresponding to said logic output and coupled to said second terminal of said load and a second terminal coupled to a reference for said supply voltage, wherein said second current conducting terminal and said current controlling terminal of said load are both coupled to said first terminal of said logic circuit.

2. Thee logic gate of claim 1 wherein said load comprises two or more depletion mode MESFETs connected in series between said second current conducting terminal of said power control device and said first terminal of said logic circuit.

3. In a gallium arsenide integrated circuit, wherein a plurality of said logic gate of claim 1 are configured to form a clocked flip-flop, said flip-flop having a cross-coupled latch for storing a current value of a logic output, said cross-coupled latch comprising MESFETs that do not have said power control device.

4. In a gallium arsenide integrated circuit, wherein a plurality of said logic gate of claim 1 are configured to form a clocked latch, said flip-flop having a cross-coupled latch for storing a current value of a logic output, said cross-coupled latch comprising MESFETs that do not have said power control device.

5. A power conserving logic gate having one or more logic inputs, a power enable input and a logic output, said logic gate comprising:
    a power control device having first and second current conducting terminals and a current controlling input, said first current conducting terminal coupled to a supply voltage and said current controlling input corresponding to said power enable input;
    a load having first and second terminals, said first terminal coupled to said second current conducting terminal of said power control device; and
    a logic circuit having one or more control terminals corresponding to said one or more logic inputs, a first terminal corresponding to said logic output and coupled to said second terminal of said load and a second terminal for receiving a reference for said supply voltage;
    wherein said supply voltage is coupled to said load through said power control device when said power enable input is at a first voltage level, and said supply voltage is substantially decoupled from said load when said power enable input is at a second voltage level; and
    wherein said first voltage level is approximately equal to one volt and said second voltage level is approximately equal to zero volts.

6. The logic gate of claim 5 wherein when said supply voltage is coupled to said load through said power control device, said logic circuit is operative to produce a first logic level on said logic output when at least one of said one or more logic inputs is at a second logic level and said second logic level on said output when each of said one or more logic inputs is at said first logic level.

7. The logic gate of claim 5 wherein said logic circuit performs a NOR logic function between said one or more logic inputs and said logic output.

8. The logic gate of claim 5 wherein said power control device, said load and said logic circuit comprise MESFETs.

9. The logic gate of claim 5 wherein said load comprises two or more depletion mode MESFETs connected in series between said second current conducting terminal of said power control device and said first terminal of said logic circuit.

10. In a gallium arsenide integrated circuit, wherein a plurality of said logic gate of claim 5 are configured to form a clocked flip-flop, said flip-flop having a cross-coupled latch for storing a current value of a logic output, said cross-coupled latch comprising MESFETs that do not have said power control device.

11. In a gallium arsenide integrated circuit, wherein a plurality of said logic gate of claim 5 are configured to form a clocked latch, said flip-flop having a cross-coupled latch for storing a current value of a logic output, said cross-coupled latch comprising MESFETs that do not have said power control device.

12. A power conserving logic gate having one or more logic inputs, a power enable input and a logic output, said logic gate comprising:
    a power control device comprising an enhancement mode MESFET having first and second current conducting terminals and a current controlling input, said first current conducting terminal coupled to a supply voltage and said current controlling input corresponding to said power enable input;
    a load comprising a depletion mode MESFET having first and second terminals, said first terminal coupled to said second current conducting terminal of said power control device; and
    a logic circuit having one or more control terminals corresponding to said one or more logic inputs, a first terminal corresponding to said logic output and coupled to said second terminal of said load and a second terminal for receiving a reference for said supply voltage; and
    wherein said supply voltage is coupled to said load through said power control device when said power enable input is at a first voltage level, and said supply voltage is substantially decoupled from said load when said power enable input is at a second voltage level.

* * * * *